(12) United States Patent
Koo

(10) Patent No.: US 7,310,753 B2
(45) Date of Patent: Dec. 18, 2007

(54) INTERNAL SIGNAL TEST DEVICE AND METHOD THEREOF

(75) Inventor: Kie Bong Koo, Chungcheongbuk-do (KR)

(73) Assignee: Hynix Semiconductor Inc., Icheon-Si (KR)

(*) Notice: Subject to any disclaimer, the term of this patent is extended or adjusted under 35 U.S.C. 154(b) by 260 days.

(21) Appl. No.: 11/024,858

(22) Filed: Dec. 30, 2004

(65) Prior Publication Data

US 2005/0289410 A1    Dec. 29, 2005

(30) Foreign Application Priority Data

Jun. 29, 2004    (KR)    ............ 10-2004-0049620

(51) Int. Cl.
*G11C 29/56*    (2006.01)
*G11C 29/32*    (2006.01)

(52) U.S. Cl. ........................... 714/718; 714/42

(58) Field of Classification Search ............. 714/718, 714/25, 42, 54, 702, 719, 763; 365/200, 365/201

See application file for complete search history.

(56) References Cited

U.S. PATENT DOCUMENTS

| 5,475,646 | A  | 12/1995 | Ogihara |
| 5,875,137 | A  | 2/1999 | Suziki ............. 365/201 |
| 6,633,504 | B1 | 10/2003 | Lee et al. |
| 6,651,196 | B1 | 11/2003 | Iwase et al. |

| 2002/0181301 | A1 | 12/2002 | Takahashi et al. |
| 2004/0179421 | A1* | 9/2004 | Kim et al. ............. 365/233 |

FOREIGN PATENT DOCUMENTS

| JP | 05-342858 | 12/1993 |
| JP | 05-342859 | 12/1993 |
| JP | 2003-297096 | 10/2003 |
| KR | 1020020044874 A | 6/2002 |
| KR | 1020030027196 A | 4/2003 |

OTHER PUBLICATIONS

Wagner et al., High-level synthesis for testability: a survey and perspective, Jun. 1996, Proceedings of the 33rd annual conference on Design automation on DAC'96, Publisher: ACM Press.*

\* cited by examiner

*Primary Examiner*—Cynthia Britt
*Assistant Examiner*—Dipakkumar Gandhi
(74) *Attorney, Agent, or Firm*—Townsend and Townsend and Crew LLP

(57) ABSTRACT

An internal signal test device tests a cycle of a specific internal signal by distinguishing a high level period and a low level period of the internal signal, at a wafer and package state by using an external test equipment. The internal signal test device comprises a refresh cycle generating unit, an input/output selecting control unit and an output buffer. The refresh cycle generating unit generates a refresh cycle signal having a predetermined cycle at entry of a refresh mode. The input/output selecting control unit selectively outputs the refresh cycle signal and a data signal in response to a test mode signal. The output control unit outputs an output signal from the input/output selecting control unit to an external output pin in response to an output clock signal controlled by the test mode signal.

18 Claims, 2 Drawing Sheets

INTERNAL SIGNAL TEST DEVICE AND METHOD THEREOF

BACKGROUND ART

1. Field of the Invention

The present invention generally relates to an internal signal test device and a method thereof, and more specifically, to a technology of testing a cycle of an internal signal by distinguishing a high level period and a low level period of the internal signal, at a wafer and package state by using an external test equipment.

2. Description of the Prior Art

Generally, a semiconductor memory device outputs an internal signal such as a refresh signal. Here, since the cycle of the internal signal is easily varied depending on changes of a process and a temperature, the cycle of the internal signal is required to be tested in order to sense the changes.

However, there are no methods for testing an internal signal at a wafer or package state. In the prior art, the internal signal is observed by naked eyes in oscilloscope using a pico probe.

The observation by naked eyes is not precise, and although changes in the cycle of other internal signals depending on changes of the process and the temperature are sensed, economical and temporal consumption becomes larger to compensate the changes.

SUMMARY OF THE INVENTION

Accordingly, it is an object of the present invention to test a cycle of an internal signal using an external test equipment at a wafer and package state.

In an embodiment, an internal signal test device comprises a refresh cycle generating unit, an input/output selecting control unit and an output buffer. The refresh cycle generating unit generates a refresh cycle signal having a predetermined cycle at entry of a refresh mode. The input/output selecting control unit selectively outputs the refresh cycle signal and a data signal in response to a test mode signal. The output control unit outputs an output signal from the input/output selecting control unit as an external output pin in response to an output clock signal controlled by the test mode signal.

In an embodiment, a test method of an internal signal test device comprises the steps of: selectively outputting a refresh cycle signal and a data signal in response to a test mode signal; and testing a cycle of the refresh cycle signal by distinguishing a high level period and a low level period of the refresh cycle signal.

In another embodiment, an internal signal test device comprises an internal signal generating unit, an input/output selecting control unit and an output control unit. The internal signal generating unit generates an internal signal having a predetermined cycle. The input/output selecting control unit selectively outputs the internal signal and a data signal in response to a test mode signal. The output control unit outputs an output signal of the input/output selecting control unit into an external output pin in response to an output clock signal controlled by the test mode signal.

The internal signal test device according to an embodiment of the present invention can be applied to all semiconductor memory devices which requires refresh operations, and may be more effective in a semiconductor memory device using a self-refresh mode.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
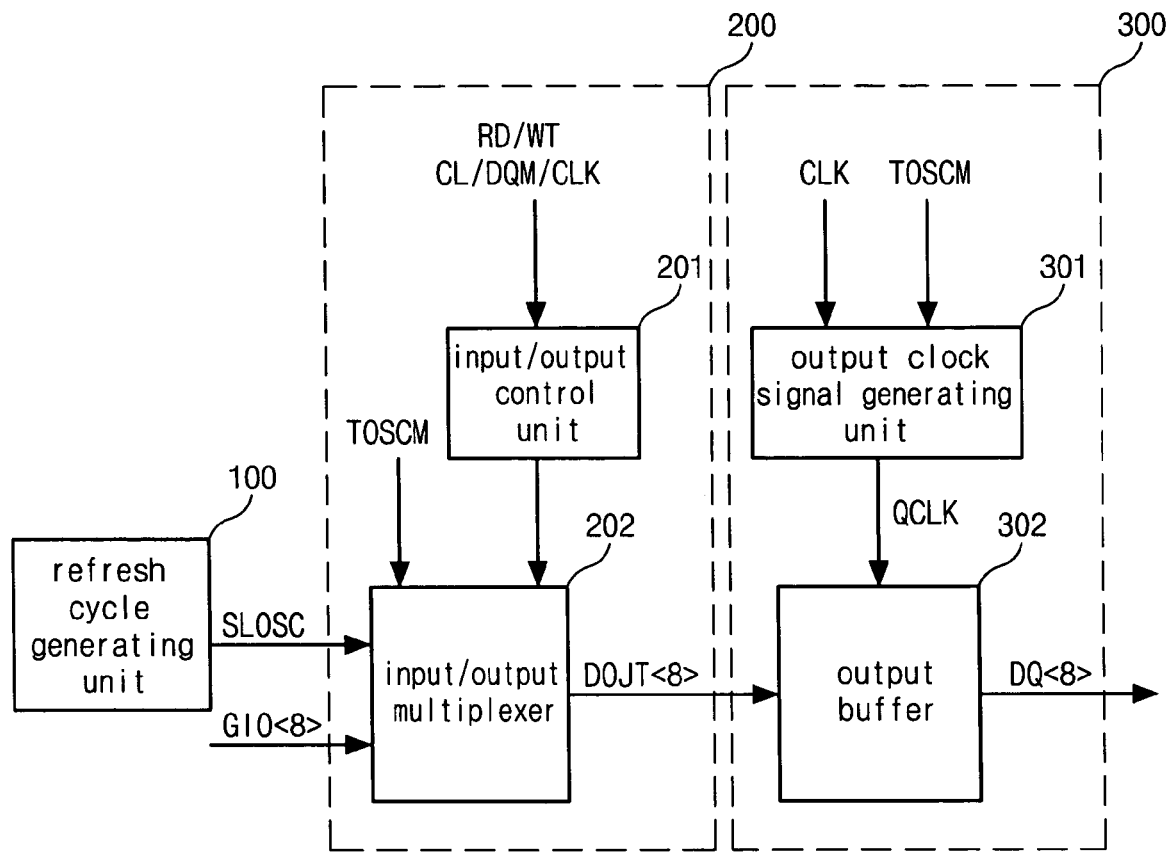
FIG. 1 is a diagram illustrating an internal signal test device according to an embodiment of the present invention.

FIG. 1 is a diagram illustrating an internal signal test device according to an embodiment of the present invention.

In an embodiment, the internal signal test device comprises a refresh cycle generating unit 100, an input/output selecting control unit 200 and an output control unit 300.

The refresh cycle generating unit 100 outputs a refresh cycle signal SLOSC which toggles with a predetermined cycle or has a pulse type. In an embodiment, a level signal which toggles with a predetermined cycle is used for testability of pass/fail decision.

The input/output selecting control unit 200 comprises an input/output control unit 201 and an input/output multiplexer 202.

The input/output control unit 201 receives command signals of a normal mode such as a read signal RD, a write signal WT, a cas latency signal CL, a clock signal CLK and an output data mask signal DQM, and controls the input/output multiplexer 202.

The input/output multiplexer 202 selectively outputs one of the refresh cycle signal SLOSC and a global input/output signal GIO<8> depending on a phase of a test mode signal TOSCM. That is, the input/output multiplexer 202 outputs the refresh cycle signal SLOSC as a selecting data DOJT when the test mode signal TOSCM is enabled to a high level, and outputs the global input/output signal GIO<8> as a selecting data DOJT<8> at the normal mode when the test mode signal TOSCM is disabled to a low level. At the normal mode, the input/output multiplexer 202 outputs the global input/output signal GIO<8> in response to command signals outputted from the input/output control unit 201.

The output control unit 300 comprises an output clock signal generating unit 301 and an output buffer 302.

The output clock signal generating unit 301 generates an output clock signal QCLK in response to the test mode signal TOSCM and the external clock signal CLK. That is, the output clock signal QCLK is outputted in response to the external clock signal CLK when the test mode signal TQSCM is enabled to a high level. When the test mode signal TOSCM is disabled to a low level, the output clock signal QCLK is toggled and outputted in response to the cas latency.

The output buffer 302 is controlled by the output clock signal QCLK, and outputs the output data DOJT<8> of the input/output multiplexer 202 as the data output signal DQ<8> through a DQ pin.

Cycles of internal signals outputted through the DQ pin at the test mode by the internal signal test device are tested by an external test equipment. That is, the test equipment determined a high level period of the output data signal DQ<8> as 'pass', and a low level period of the output data signal DQ<8> as 'fail'. The above-described procedure is repeated to test the cycles of the internal signals.

As described above, changes in the cycles of the internal signals depending on process and temperature variation are easily sensed, so that the changes are flexibly coped with. Also, the results tested in an embodiment of the present invention, which are cycles of refresh cycle signals, are subdivided using external fuses, thereby reducing power consumption.

Although the embodiment of FIG. 1 to test the cycle of the refresh cycle signal is exemplified, cycles of all internal signals each having a predetermined cycle of a semiconductor memory device as well as refresh cycle signals can be measured.

Figure 2:
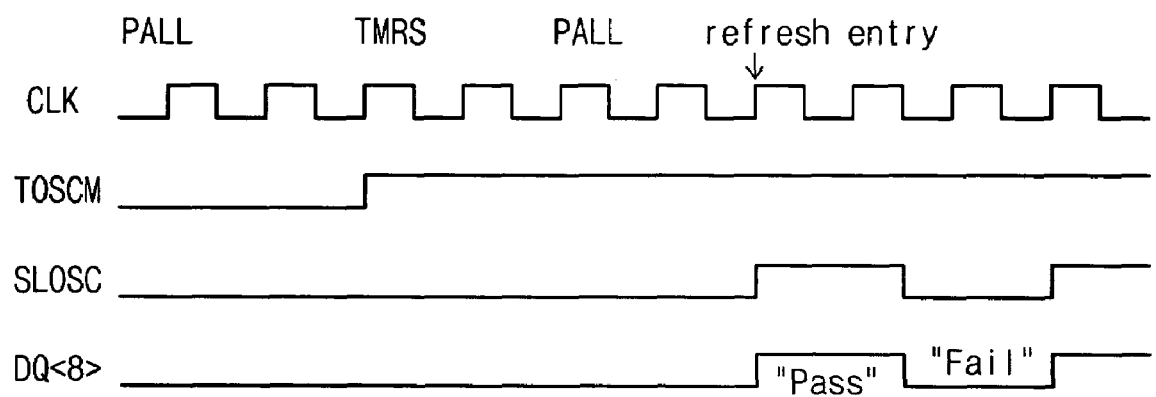
FIG. 2 is a timing diagram illustrating the operation of the internal signal test device of FIG. 1.

FIG. 2 is a timing diagram illustrating the operation of the internal signal test device of FIG. 1.

As shown in FIG. 2, the external clock signal CLK toggles regularly, and precharges all banks by a precharge command signal PALL at an early stage. Thereafter, when a test mode register setting signal TMRS is applied, the test mode signal TOSCM is enabled to a high level.

Then, when a refresh mode starts, the refresh cycle signal SLOSC starts to be oscillated. When the test mode signal TOSCM is enabled, the data output signal DQ<8> is outputted in response to the refresh cycle signal SLOSC.

The external test equipment determines the high level period of the data output signal DQ<8> as "Pass", and the low level period of the data output signal DQ<8> as "Fail", thereby measuring the cycle of the data output signal DQ<8>, that is, the refresh cycle signal SLOSC.

As discussed earlier, in an embodiment of the present invention, a cycle of an internal signal can be tested by using an external test equipment at a wafer and package state.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. An internal signal test device comprising:
   a refresh cycle generating unit for generating a refresh cycle signal having a predetermined cycle at entry of a refresh mode;
   an input/output selecting control unit for outputting the refresh cycle signal at a test mode and outputting a global input/output signal as a data signal at a normal mode; and
   an output control unit for outputting an output signal from the input/output selecting control unit to an external output pin in response to an output clock signal controlled by an external clock signal and a test mode signal.

2. The device according to claim 1, wherein the refresh cycle generating unit outputs the refresh cycle signal which toggles with the predetermined cycle.

3. The device according to claim 1, wherein the refresh cycle generating unit outputs the refresh cycle signal of a pulse type having the predetermined cycle.

4. The device according to claim 1, wherein the input/output selecting control unit comprises:
   an input/output control unit for receiving a command signal at the normal mode; and
   an input/output multiplexer for selectively outputting the refresh cycle signal and the data signal in response to the test mode signal, wherein the data signal is outputted in response to an output signal from the input/output control unit.

5. The device according to claim 4, wherein the input/output multiplexer outputs the data signal in response to a read signal, a write signal, a cas latency signal, a clock signal and an output data mask signal when the test mode signal is disabled to a low level.

6. The device according to claim 1, wherein the output control unit comprises:
   an output clock signal generating unit for generating the output clock signal in response to the test mode signal and a clock signal; and
   an output buffer for outputting an output signal from the input/output selecting control unit into the external output pin in response to the output clock signal.

7. The device according to claim 6, wherein the output clock signal generating unit outputs the output clock signal in response to the cas latency signal when the test mode signal is enabled to a high level, and outputs the output clock signal in response to the clock signal regardless of the cas latency when the test mode signal is disabled to a low level.

8. The device according to claim 6, wherein the output buffer outputs an output signal of the input/output selecting control unit into the external output pin when the output clock signal is enabled to a high level.

9. A test method of an internal signal test device, comprising:
   a first step of selectively outputting a refresh cycle signal and a data signal in response to a test mode signal;
   a second step of outputting the refresh cycle signal or the data signal to an external output pin in response to an external clock signal and the test mode signal; and
   a third step of testing cycle of internal signal outputted through the external output pin.

10. The test method according to claim 9, wherein in the first step, the refresh cycle signal is outputted when the test mode signal is enabled to a high level and the data signal is outputted when the test mode signal is disabled to a low level.

11. The test method according to claim 10, wherein in the first step, the data signal is outputted in response to a read signal, a write signal, a cas latency signal, a clock signal and an output data mask signal.

12. The test method according to claim 9, wherein in the third step, the cycle of internal signal is tested by distinguishing a high level period and a low level period of the refresh cycle signal.

13. An internal signal test device comprising:
   an internal signal generating unit for generating an internal signal having a predetermined cycle;
   an input/output selecting control unit for outputting the internal signal at a test mode and outputting a global input/output signal as a data signal at a normal mode; and
   an output control unit for outputting an output signal of the input/output selecting control unit into an external output pin in response to an output clock signal controlled by an external clock signal and a test mode signal.

14. The device according to claim 13, wherein the input/output selecting control unit comprises:
   an input/output control unit for receiving a command signal at the normal mode; and
   an input/output multiplexer for selectively outputting the internal signal and the data signal in response to the test mode signal, wherein the data signal is outputted in response to an output signal from the input/output control unit.

15. The device according to claim 14, wherein the input/output multiplexer outputs the data signal in response to a read signal, a write signal, a cas latency signal, a clock signal and an output data mask signal which are received from the input/output control unit when the test mode signal is disabled to a low level.

16. The device according to claim 15, wherein the output control unit comprises:
an output clock signal generating unit for generating the output clock signal in response to the test mode signal and a clock signal; and
an output buffer for outputting an output signal of the input/output selecting control unit into the external output pin in response to the output clock signal.

17. The device according to claim 16, wherein the output clock signal generating unit outputs the output clock signal in response to the cas latency when the test mode signal is enabled to a high level, and outputs the output clock signal in response to the clock signal regardless of the cas latency when the test mode signal is disabled to a low level.

18. The device according to claim 16, wherein the output buffer outputs an output signal of the input/output selecting control unit into the external output pin when the output clock signal is enabled to a high level.

* * * * *